(12) United States Patent
Rabkin et al.

(10) Patent No.: US 9,331,093 B2
(45) Date of Patent: May 3, 2016

(54) THREE DIMENSIONAL NAND DEVICE WITH SILICON GERMANIUM HETEROSTRUCTURE CHANNEL

(71) Applicant: SANDISK TECHNOLOGIES INC., Plano, TX (US)

(72) Inventors: Peter Rabkin, Cupertino, CA (US); Jayavel Pachamuthu, San Jose, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/505,870

(22) Filed: Oct. 3, 2014

(65) Prior Publication Data

US 2016/0099250 A1    Apr. 7, 2016

(51) Int. Cl.
| | | |
|---|---|---|
| H01L 27/115 | (2006.01) | |
| H01L 29/165 | (2006.01) | |
| H01L 29/167 | (2006.01) | |
| H01L 29/04 | (2006.01) | |
| H01L 21/28 | (2006.01) | |
| H01L 21/02 | (2006.01) | |
| H01L 29/10 | (2006.01) | |
| H01L 29/78 | (2006.01) | |
| H01L 29/66 | (2006.01) | |

(52) U.S. Cl.
CPC ...... *H01L 27/1157* (2013.01); *H01L 21/02381* (2013.01); *H01L 21/02532* (2013.01); *H01L 21/28273* (2013.01); *H01L 21/28282* (2013.01); *H01L 27/11524* (2013.01); *H01L 27/11556* (2013.01); *H01L 27/11582* (2013.01); *H01L 29/04* (2013.01); *H01L 29/1054* (2013.01); *H01L 29/165* (2013.01); *H01L 29/167* (2013.01); *H01L 29/7842* (2013.01)

(58) Field of Classification Search
USPC .......... 257/319, 314, 316, 324, 326, E21.645, 257/E21.422, E21.409, E29.3, E29.309
See application file for complete search history.

(56) References Cited

U.S. PATENT DOCUMENTS

| | | | |
|---|---|---|---|
| 5,915,167 | A | 6/1999 | Leedy |
| 8,349,681 | B2 | 1/2013 | Alsmeier et al. |

OTHER PUBLICATIONS

Endoh et al., "Novel Ultra High Density Memory with a Stacked-Surrounding Gate Transistor (S-SGT) Structured Cell," IEDM Proc. (2001) 33-36.

Jung et al., "Implementation of Both High-Hole and Electron Mobility in Strained Si/Strained $Si_{1-y}Ge_y$ on Relaxed $Si_{1-x}Ge_x$ (x<y) Virtual Substrate," IEEE Electron Device Letters, vol. 24, No. 7, Jul. 2003.

(Continued)

*Primary Examiner* — Timor Karimy
(74) *Attorney, Agent, or Firm* — The Marbury Law Group PLLC

(57) ABSTRACT

A method of making a monolithic three dimensional NAND string including forming a stack of alternating layers of a first material and a second material different from the first material over a substrate, forming an at least one opening in the stack, forming at least a portion of a memory film in the at least one opening and forming a first portion of a semiconductor channel followed by forming a second portion of the semiconductor channel in the at least one opening. The second portion of the semiconductor channel comprises silicon and germanium and contains more germanium than a first portion of the semiconductor channel which is located closer to the memory film than the second portion.

20 Claims, 10 Drawing Sheets

(56) References Cited

OTHER PUBLICATIONS

Watakabe et al., "Electrical and Structural Properties of Poly-SiGe Film Formed by Pulsed-Laser Annealing," Journal of Applied Physics, vol. 95, No. 11, Jun. 2004.

Datta et al., "Advanced Si and SiGe Strained Channel NMOS and PMOS Transistors with High-K/Metal-Gate Stack," IEEE BCTM 10.2, 2004.

Jin et al., "High-Performance Polycrystalline SiGe Thin-Film Transistors Using $Al_2O_3$ Gate Insulators," IEEE Electron Device Letters, vol. 19, No. 12, Dec. 1998.

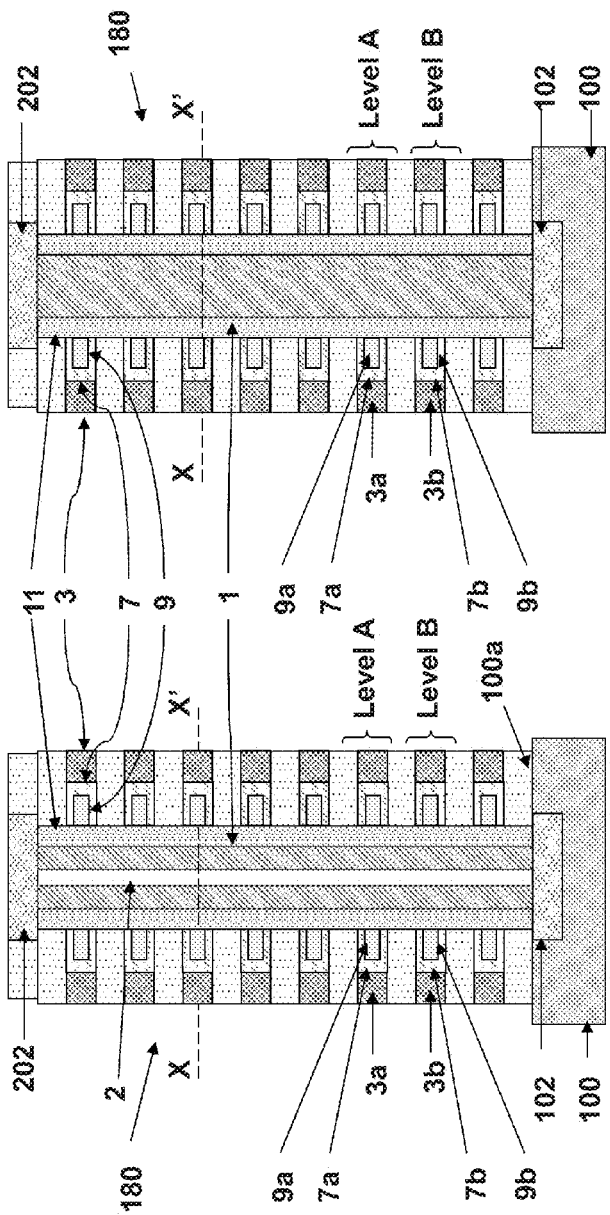

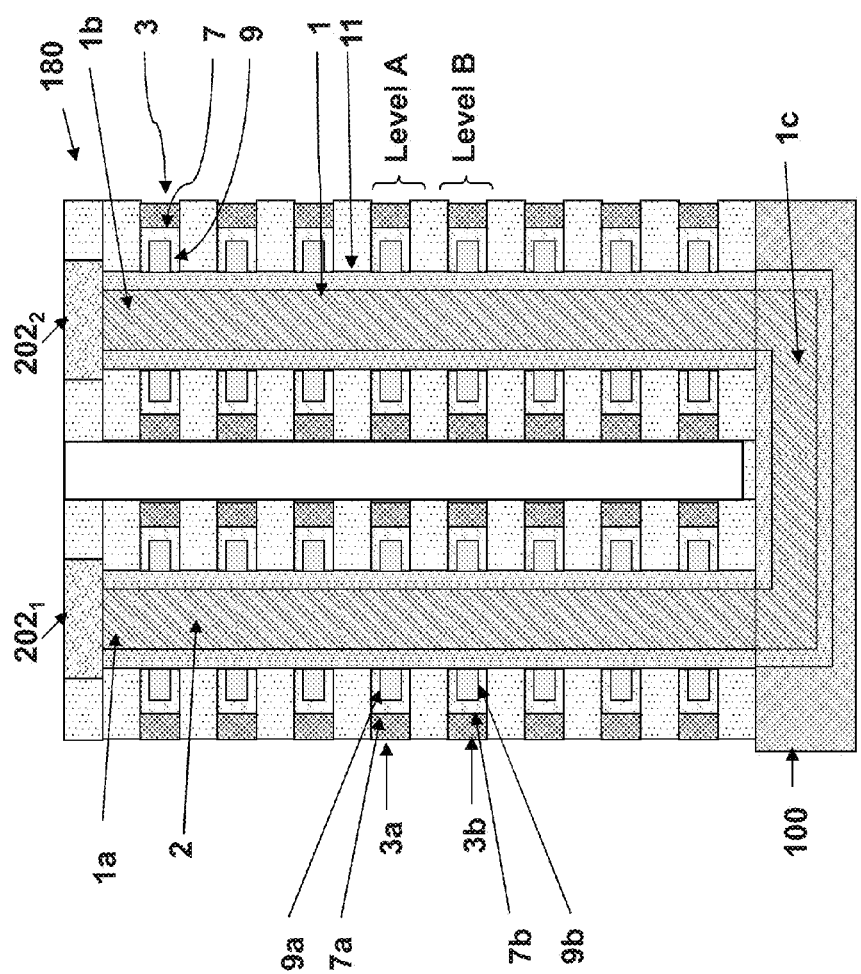

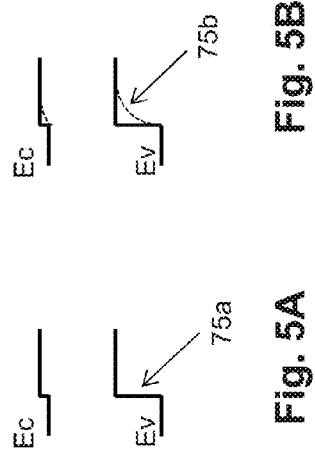
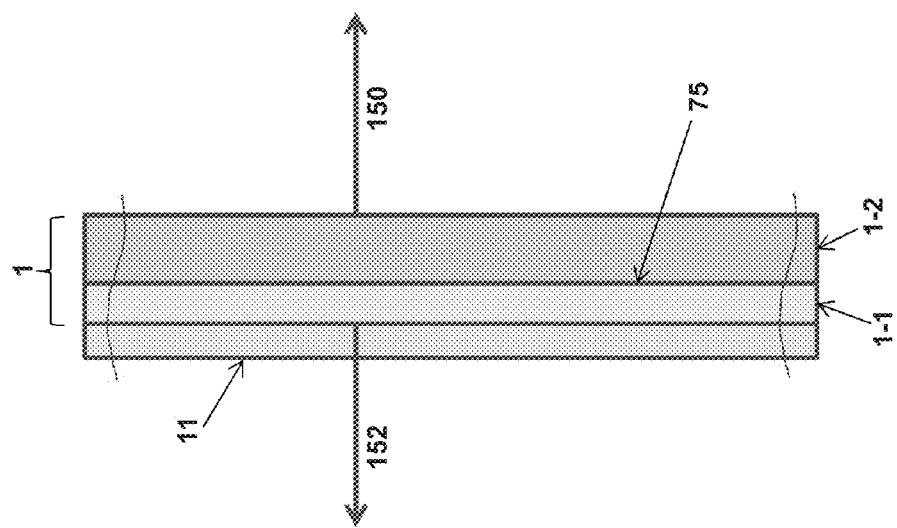

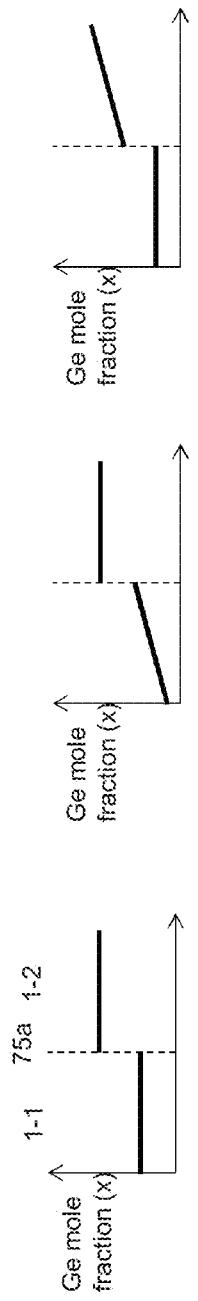
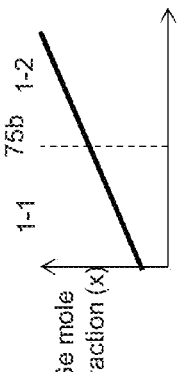
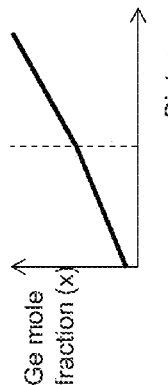
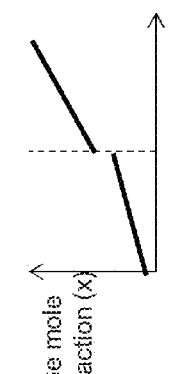
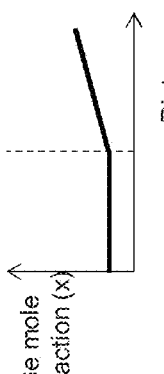
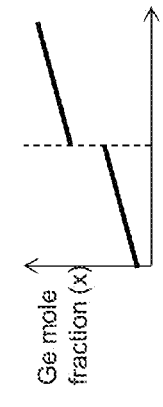
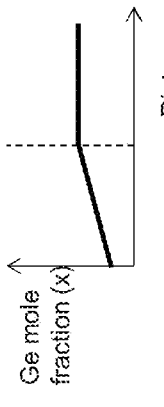
Fig. 7A  Fig. 7B  Fig. 7C
Fig. 7D  Fig. 7E  Fig. 7F
Fig. 7G  Fig. 7H  Fig. 7I

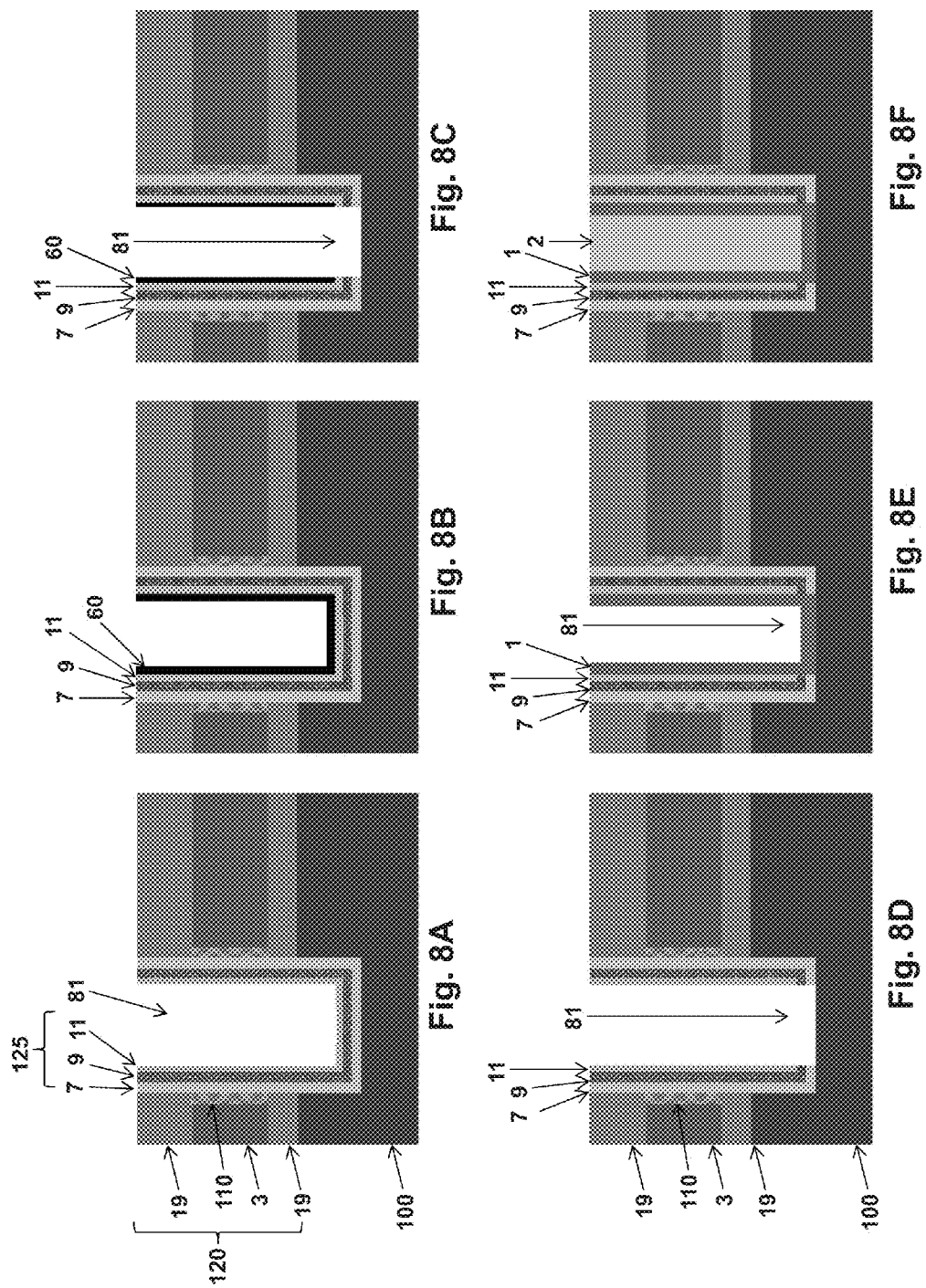

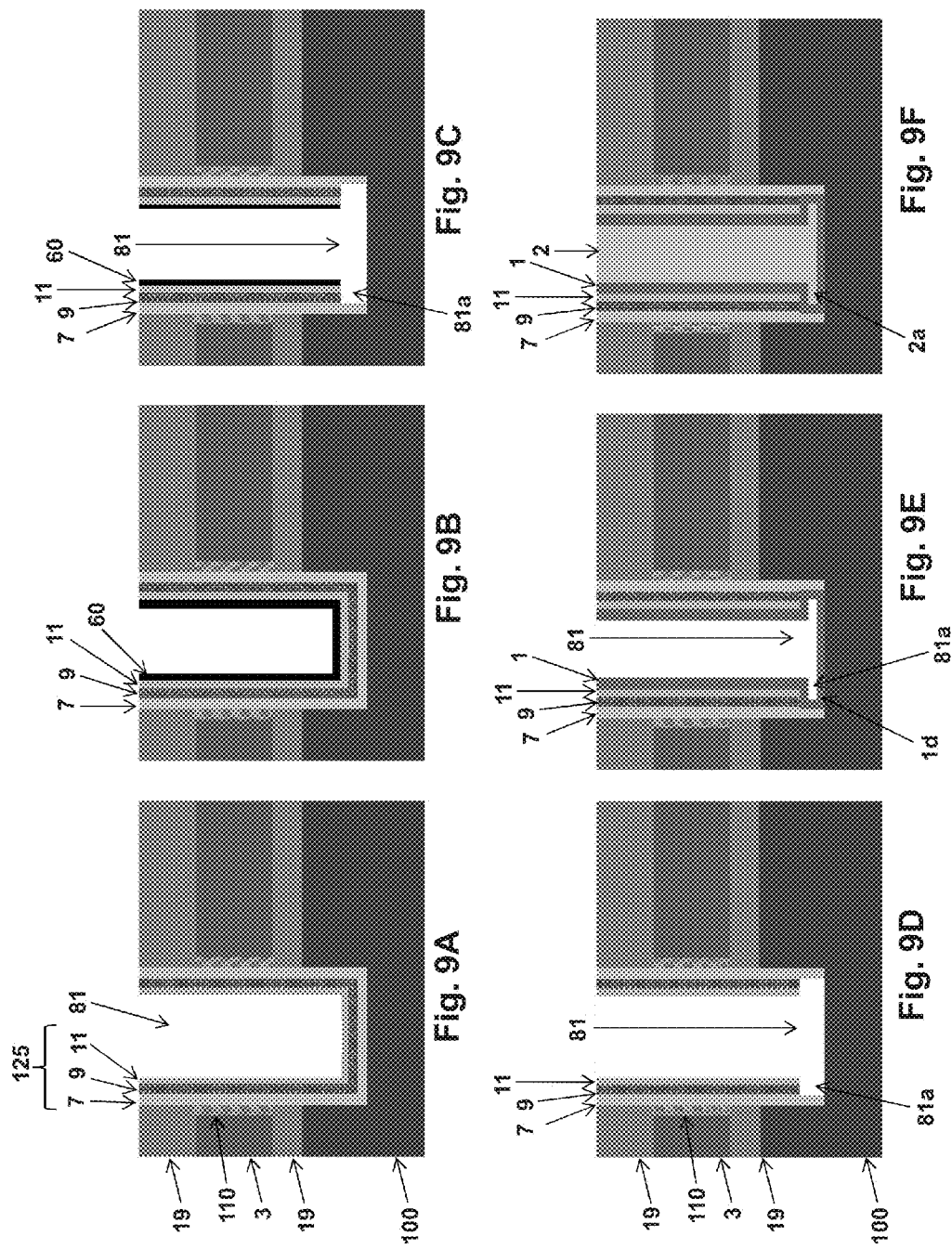

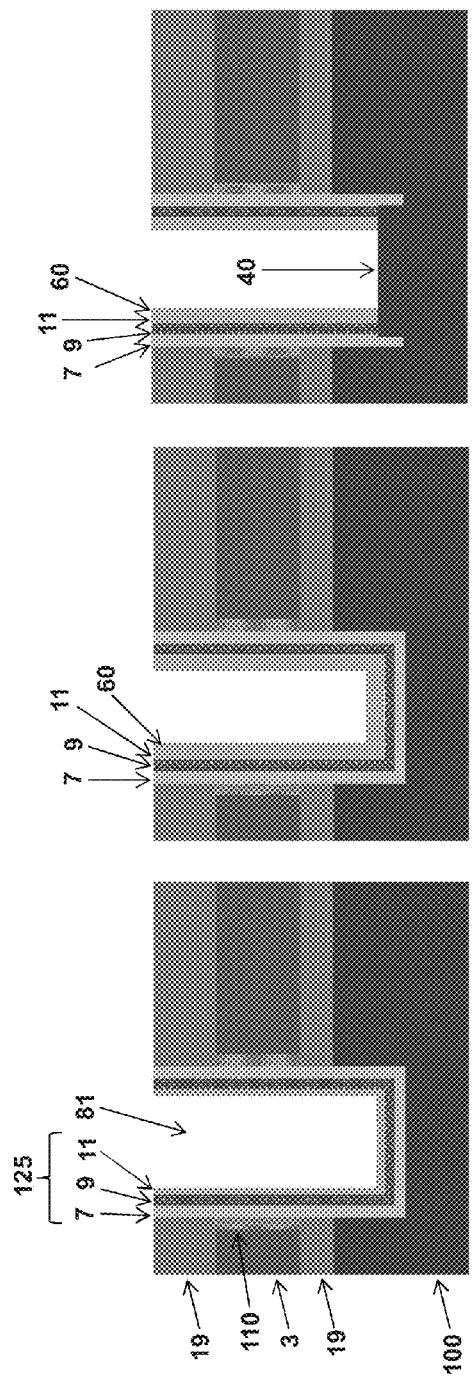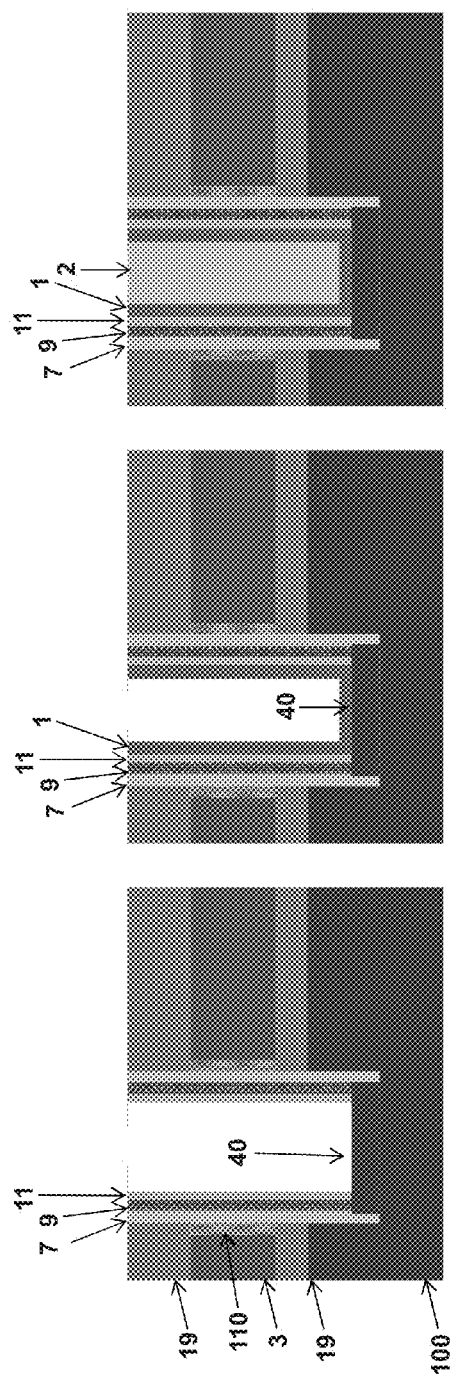

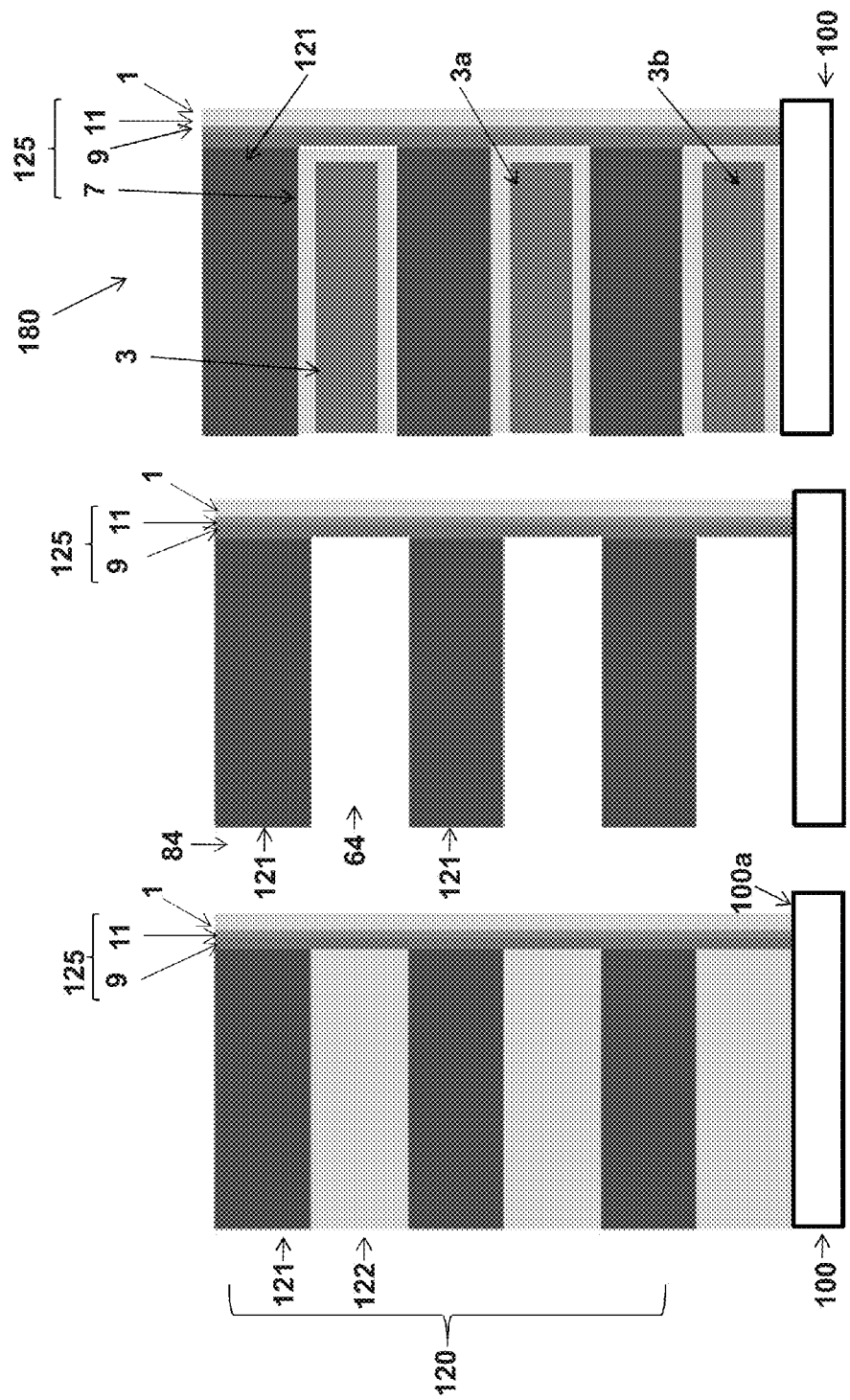

US 9,331,093 B2

THREE DIMENSIONAL NAND DEVICE WITH SILICON GERMANIUM HETEROSTRUCTURE CHANNEL

FIELD

The present disclosure relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

An embodiment relates to a monolithic three dimensional NAND string including a semiconductor channel with at least one end part of the semiconductor channel extending substantially perpendicular to a major surface of a substrate and a plurality of control gate electrodes extending substantially parallel to the major surface of the substrate. The plurality of control gate electrodes include at least a first control gate electrode located in a first device level and a second control gate electrode located in a second device level located over the major surface of the substrate and below the first device level. The first control gate electrode is separated from the second control gate electrode by an insulating layer located between the first and second control gates. The NAND string also includes a blocking dielectric located adjacent the plurality of control gate electrodes, at least one charge storage region located adjacent the blocking dielectric and a tunnel dielectric located between the at least one charge storage region and the semiconductor channel. A second portion of the semiconductor channel includes silicon and germanium and contains more germanium than a first portion of the semiconductor channel which is located closer to the tunnel dielectric than the second portion.

Another embodiment relates to a method of making a monolithic three dimensional NAND string including forming a stack of alternating layers of a first material and a second material different from the first material over a substrate, forming an at least one opening in the stack, forming at least a portion of a memory film in the at least one opening and forming a first portion of a semiconductor channel followed by forming a second portion of the semiconductor channel in the at least one opening. A second portion of the semiconductor channel comprises silicon and germanium and contains more germanium than a first portion of the semiconductor channel which is located closer to the memory film than the second portion.

BRIEF DESCRIPTION OF THE DRAWINGS

FIGS. 1A and 1B are respectively side cross sectional and top cross sectional views of a NAND string according to one embodiment. FIG. 1A is a side cross sectional view of the device along line Y-Y' in FIG. 1B, while FIG. 1B is a side cross sectional view of the device along line X-X' in FIG. 1A.

FIGS. 2A and 2B are respectively side cross sectional and top cross sectional views of a NAND string according to another embodiment. FIG. 2A is a side cross sectional view of the device along line Y-Y' in FIG. 2B, while FIG. 2B is a side cross sectional view of the device along line X-X' in FIG. 2A.

FIG. 3A is a side cross sectional view of a NAND string of another embodiment with a U-shaped channel.

FIG. 4 is a side cross sectional view of a compound heterostructure channel according to an embodiment.

FIGS. 5A and 5B are energy band diagrams illustrating an (A) abrupt heterojunction and a (B) graded heterojunction, respectively.

FIGS. 7A-7I are plots of the concentration of germanium versus distance in the channel for embodiments of compound heterostructure channels.

FIGS. 8A-8F are side cross sectional views of illustrating a method of making a channel for a NAND string device according to an embodiment.

FIGS. 9A-9F are side cross sectional views of illustrating a method of making a channel for a NAND string device according to another embodiment.

FIGS. 10A-10F are side cross sectional views of illustrating a method of making a channel for a NAND string device according to another embodiment.

FIGS. 11A-11C are side cross sectional views of illustrating a method of making a channel for a NAND string device according to another embodiment.

DETAILED DESCRIPTION

Figure 3B:
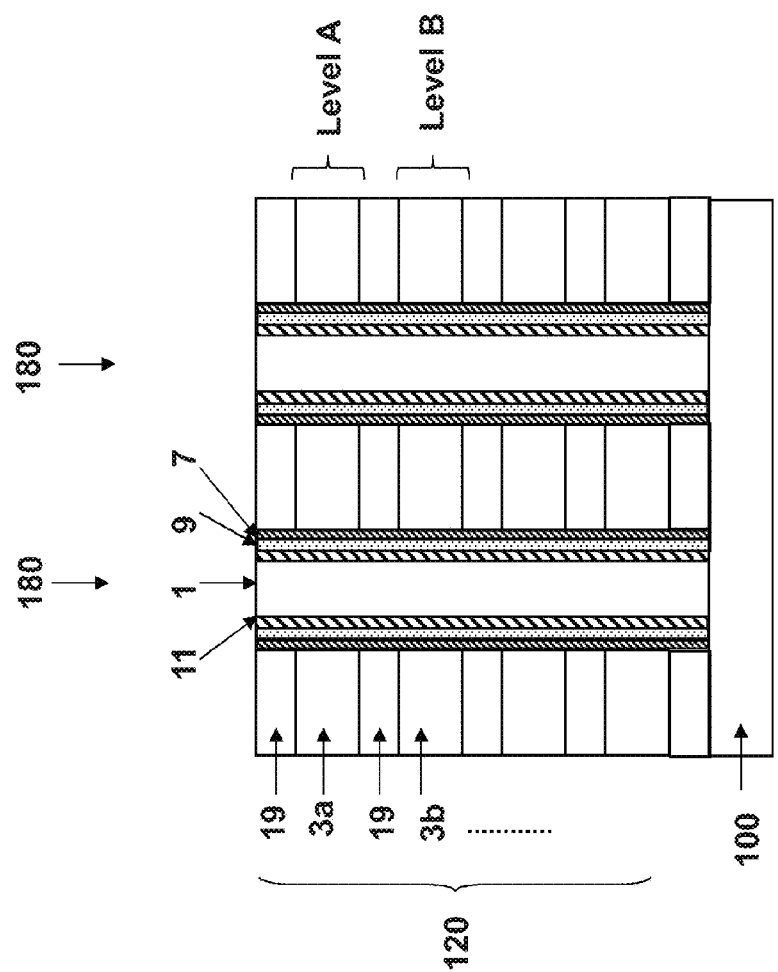
FIG. 3B is a side cross sectional view of another embodiment NAND string.

Polysilicon has a relatively low electron mobility. This low electron mobility results in low cell current in three dimensional ("3D") NAND devices having a polysilicon channel. The present inventors have realized that a silicon germanium ("SiGe") heterostructure containing channel and its strain effects for 3D NAND devices may allow increasing electron mobility 4-5 times or more, such as around 40-50 cm$^2$/Vs or more, versus a polysilicon channel. As a result, the cell current and overall 3D NAND device performance can be improved.

In an embodiment, the channel has a first portion and a second portion. The second (germanium rich) portion of the channel has a higher germanium content than the first (germanium poor) portion. In one embodiment, the first portion is made of substantially germanium free polysilicon and the second portion is made of polycrystalline SiGe. The germanium concentration in $Si_{1-x}Ge_x$ may range from $0 \leq x \leq 0.8$, such as $0.1 \leq x \leq 0.7$, such as $0.2 \leq x \leq 0.6$, such as $0.3 \leq x \leq 0.5$.

In another embodiment, the entire channel can be made of poly SiGe without the substantially germanium free polysilicon layer. In this embodiment, the first portion of the channel comprises SiGe containing a lower Ge concentration than the SiGe of the second portion of the channel.

As discussed in more detail below, the concentration of germanium in the channel may be constant or graded in the first portion, the second portion or in both the first and second portions in any combination.

In an embodiment, the germanium concentration is the same in a direction perpendicular to the longitudinal direction of the channel (i.e., parallel to the major surface of the substrate). Thus, the Ge composition is constant throughout the first or the second portions of the channel.

In another embodiment, the germanium concentration varies in direction perpendicular to the longitudinal direction of the channel (i.e., parallel to the major surface of the substrate). The germanium mole fraction may increase from tunnel dielectric toward the center of the channel or the interface with an optional insulating fill material (core dielectric), if used. The germanium concentration may range from 0.0 to 0.8, such as 0.1 to 0.7, such as 0.2 to 0.6, such as 0.3-0.5. In this configuration, a graded SiGe heterostructure is formed with a build-in field that pushes electrons towards the interface with the tunnel dielectric and holes toward the interface with the insulating core dielectric. The electron and hole mobilities are higher than in pure, unstrained polysilicon.

In an embodiment, the interface between the first and second portions of the channel may be abrupt. That is, the concentration of germanium on one side of the interface between the first and second portions of the channel may be measurably lower or higher the concentration of the germanium on the other side of the interface. For example, in this embodiment, the germanium concentration, as a function of the coordinate in the direction parallel to the major surface of the substrate, has a discontinuity at the interface between the first and the second portions of the channel. In other words, the germanium concentration has different values at the two sides of the interface between the first and the second portion of the channel.

In an alternative embodiment, the first and second portions of the channel may be formed such that the concentrations of germanium in the first and second portions of the channel are not abrupt (i.e., the same) at the interface between the first and second portions of the channel (i.e., a graded or continuous interface). For example, in this embodiment, the germanium concentration is a continuous function of the coordinate in the direction parallel to the major surface of the substrate, including at the interface between the first and the second portions of the channel.

Electrons tend to be confined in the germanium poor first portion of the channel (e.g. a substantially germanium free polysilicon layer) due to a built-in heterojunction field. In contrast, holes tend to be confined in germanium rich second portion of the channel (e.g., the SiGe layer). Further, the difference in lattice constants between polysilicon and polycrystalline SiGe nano-crystals tends to create tensile stress in the polysilicon layer and compressive stress in the SiGe layer. Tensile stress will be induced into the germanium poor first portion and compressive stress induced into germanium rich second portion of the channel because the lattice constant of germanium is bigger than silicon. These induced stresses enhance both electron and hole mobilities.

The tensile stress in the germanium poor (e.g., polysilicon) layer results in higher electron mobility. The higher electron mobility results in increased cell current and better programming and read performance. Compressive stress in SiGe layer results in higher hole mobility in SiGe layer. The higher hole mobility results in faster erase times. The band gap and stress in the heterostructure channel can be controlled with the layer thickness, selection of deposition method and Ge concentration in the SiGe layer(s). Therefore, a 3D NAND device with any of the two portion heterostructure channel architectures described herein may exhibits higher cell current and better program and erase efficiency due to higher carrier mobility than devices with all polysilicon channels.

The abrupt or graded heterojunction may be formed between the first and second portions of the heterostructure channel during deposition. After forming the heterostructure channel, one or more crystallization anneals may be performed.

In an embodiment, amorphous silicon (a-Si) (i.e., the first portion of the channel) is deposited by plasma-enhanced chemical vapor deposition (PECVD) using $SiH_4$. Then, a mixture of $SiH_4$ and $GeH_4$ is used to deposit the a-SiGe layer (i.e., the second portion of the channel). The Ge content in the layer is controlled by adjusting the ratio of $SiH_4$ to $GeH_4$. For example, a-SiGe may be deposited by PECVD at 300° C. and 0.3 Torr using $SiH_4$ and $GeH_4$ mixture gases.

The a-Si and/or a-SiGe layers may be crystallized using a thermal (e.g., furnace) anneal, rapid thermal anneal (e.g., flash lamp anneal) and/or laser anneal. As an example, a thermal anneal may include a furnace anneal at 600-700° C. in $N_2$/Ar ambient for 30-250 min, such as 60-150 min. The rapid thermal anneal may include a flash lamp anneal at 950-1100° C. in $N_2$/Ar ambient for a fraction of a second, such as 10-1000 ms, such as 100-500 ms. The laser anneal may include a XeCl excimer laser (308 nm) irradiation anneal in vacuum (e.g., at about $10^{-6}$ Torr) without substrate heating. Multiple (e.g. 3-5) step laser irradiation can be carried out. In an embodiment, the laser energy density can be 150 to 360 $mJ/cm^2$. In an embodiment, the laser energy density may be increased with a step of 20-40 $mJ/cm^2$ for samples with Ge concentrations from 0 to 80%. The energy density may be optimized based on crystallization threshold energies. Large average poly grain size of approximately 60-120 nm for Ge compositions of 0 to 60% can be achieved.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

In some embodiments, the monolithic three dimensional NAND string 180 comprises a semiconductor channel 1 having at least one end portion extending substantially perpendicular to a major surface 100*a* of a substrate 100, as shown in FIGS. 1A, 2A and 3B. "Substantially perpendicular to" (or "substantially parallel to") means within 0-10°. For example, the semiconductor channel 1 may have a pillar shape and the entire pillar-shaped semiconductor channel extends substantially perpendicularly to the major surface of the substrate 100, as shown in FIGS. 1A, 2A and 3B. In these embodiments, the source/drain electrodes of the device can include a lower electrode 102 provided below the semiconductor channel 1 and an upper electrode 202 formed over the semiconductor channel 1, as shown in FIGS. 1A and 2A.

Alternatively, the semiconductor channel 1 may have a U-shaped pipe shape, as shown in FIG. 3A. The two wing portions 1*a* and 1*b* of the U-shaped pipe shape semiconductor channel may extend substantially perpendicular to the major surface 100*a* of the substrate 100, and a connecting portion 1*c* of the U-shaped pipe shape semiconductor channel 1 connects the two wing portions 1*a*, 1*b* extends substantially parallel to the major surface 100*a* of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional back gate electrode (not shown) may be disposed in the substrate 100 below the semiconductor channel 1. The NAND string's select or access transistors are not shown in FIGS. 1-3B for clarity.

In some embodiments, the semiconductor channel 1 may be a filled feature, as shown in FIGS. 2A, 2B, 3A and 3B. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3A and/or the channel 1 shown in FIG. 3B may alternatively be a hollow cylinder filled with an insulating fill material 2, shown in FIGS. 1A-1B.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

As discussed in above and in more detail below, the semiconductor channel 1 includes two portions with a heterojunction interface between the portions as illustrated in FIG. 4. The first portion 1-1 of the channel 1 may comprise silicon or silicon germanium. The second portion 1-2 of the channel 1 may comprise silicon germanium. In an embodiment, the concentration of germanium in the second portion 1-2 is greater than the concentration of the germanium in the first portion 1-1. As discussed below in more detail in the discussion of FIG. 7A-7I, the germanium concentration may be constant or graded in either or both the first portion 1-1 and the second portion 1-2 of the channel 1. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, 3A and 3B. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride or alloys thereof. For example, the control gate material in FIGS. 1A, 2A and 3A may comprise a conductive metal or metal alloy, such as tungsten and/or titanium nitride, while the control gate material in FIG. 3B may comprise doped polysilicon.

A blocking dielectric 7 is located adjacent to the control gate(s) 3 and may surround the control gate electrodes 3, as shown in FIGS. 1A, 2A and 3A. Alternatively, a straight blocking dielectric layer 7 may be located only adjacent to an edge (i.e., minor surface) of each control gate electrode 3, as shown in FIG. 3B. The blocking dielectric 7 may comprise a layer having plurality of blocking dielectric segments located in contact with a respective one of the plurality of control gate electrodes 3, for example a first blocking dielectric segment 7a located in device level A and a second blocking dielectric segment 7b located in device level B are in contact with control electrodes 3a and 3b, respectively, as shown in FIG. 3A. Alternatively, the blocking dielectric 7 may be a straight, continuous layer, as shown in FIG. 3B, similar to the device described in U.S. Pat. No. 8,349,681 issued on Jan. 8, 2013 and incorporated herein by reference in its entirety.

The monolithic three dimensional NAND string also comprise a charge storage region 9. The charge storage region 9 may comprise one or more continuous layers which extend the entire length of the memory cell portion of the NAND string, as shown in FIG. 3B. For example, the charge storage region 9 may comprise an insulating charge trapping material, such as a silicon nitride layer.

Alternatively, the charge storage region may comprise a plurality of discrete charge storage regions 9, as shown in FIGS. 1A, 2A and 3A. The plurality of discrete charge storage regions 9 comprise at least a first discrete charge storage region 9a located in the device level A and a second discrete charge storage region 9b located in the device level B, as shown in FIG. 3A. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials. The blocking dielectric 7 and/or the tunnel dielectric 11 may include multiple layers of silicon oxide, silicon nitride and/or silicon oxynitride (e.g., ONO layers).

FIG. 4 is a side cross sectional view of a compound heterostructure channel 1 according to an embodiment. The channel 1 includes a first portion 1-1 and a second portion 1-2 separated by an interface 75. The interface 75 is a heterojunction. That is, the materials of the first 1-1 and second 1-2 portions have dissimilar crystalline structures and/or compositions. Further, the first 1-1 and second 1-2 portions have unequal band gaps as illustrated in FIGS. 5A and 5B and discussed in more detail below. The first portion 1-1 of the semiconductor channel 1 is located adjacent the tunnel dielectric 11 of a memory film as indicated by the direction arrow 152. The second portion 1-2 of the semiconductor channel 1 is located away from the tunnel dielectric, i.e. toward a center of a pillar shaped channel 1 or toward the optional insulating fill 2 as indicated by the direction arrow 150.

FIGS. 5A and 5B illustrate energy band diagrams illustrating an (A) abrupt heterojunction 75a and a (B) continuous heterojunction 75b, respectively. As discussed above and illustrated in FIGS. 5A and 5B, the semiconducting materials on either side of a heterojunction have different band gap heights. In the embodiment illustrated in FIG. 5A, the germanium concentration at the interface 75a in the first portion 1-1 of the semiconductor channel 1 is less than the concentration of the germanium at the interface 75a in the second portion 1-2 of the semiconductor channel. In the embodiment illustrated in FIG. 5B, the concentration of germanium in first portion 1-1, the second portion 1-2 or both portions 1-1, 1-2 is graded such that the concentration of germanium at the interface 75b is the same in the first portion 1-1 and the second portion 1-2 of the semiconductor channel 1.

Figure 6:
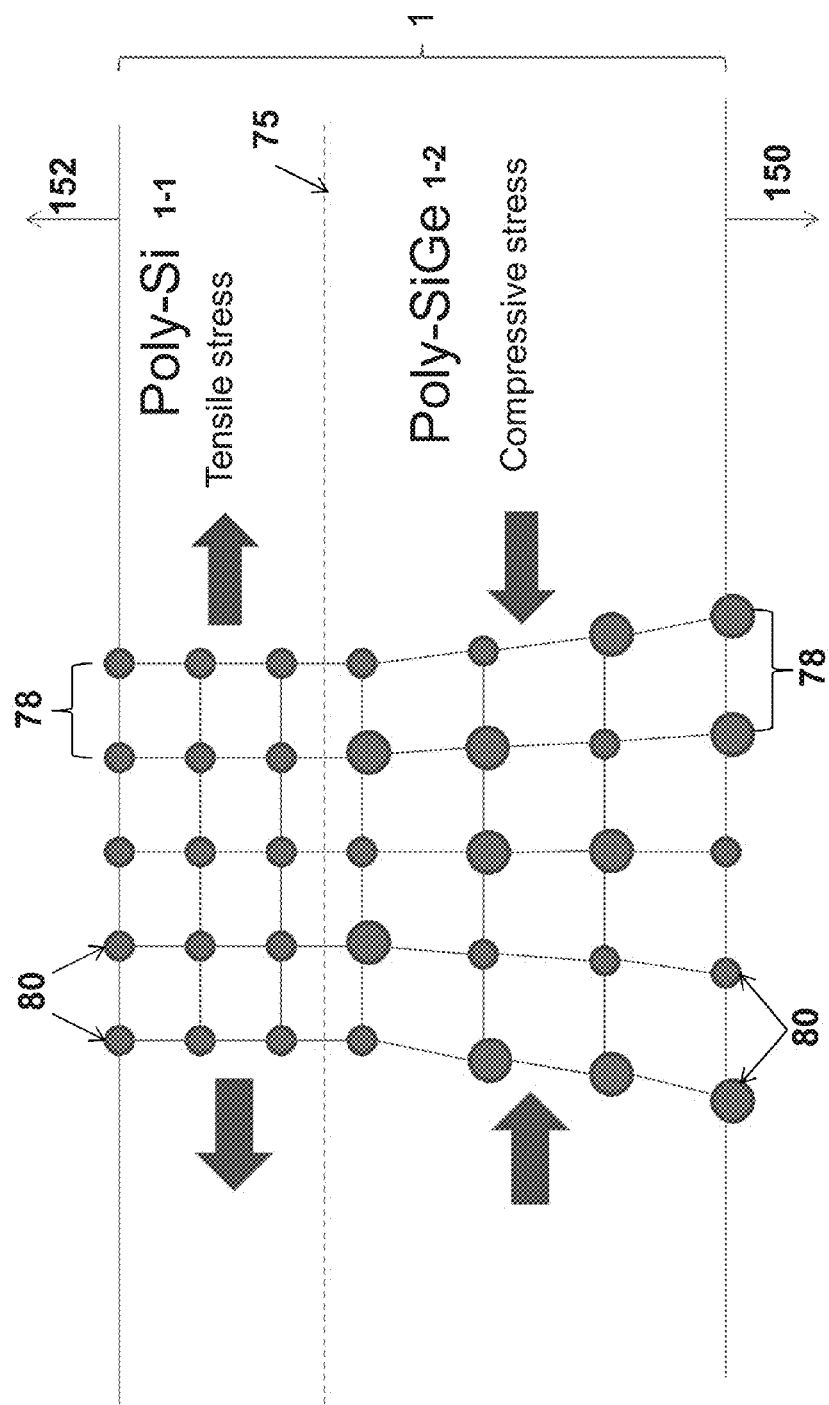
FIG. 6 is a lattice model illustrating the atomic structure at the interface of a compound heterojunction channel.

FIG. 6 is a schematic lattice model illustrating the atomic structure at the interface 75 of a compound heterojunction channel 1 (e.g., showing a simple cubic rather than FCC unit cell structure for ease of illustration). The lattice model of FIG. 6 is rotated 90 degrees clockwise relative to the side cross sectional view illustrated in FIG. 4. As illustrated in FIG. 6, the material with the lower germanium content (first portion 1-1 of the channel 1) has a smaller lattice parameter 78 than the material with a higher germanium content (second portion 1-2 of the channel 1). That is, the atoms 80 in the material with a lower germanium content are closer together than the atoms in the material with a higher germanium content. This is because the germanium atom is larger than the silicon atom. As a result of having different lattice parameters 78, the material with the larger lattice parameter, e.g. Ge rich SiGe, exerts a tensile stress on the material with the smaller lattice parameter, e.g. Si or Ge poor SiGe, while the material with the small lattice parameter 78 exerts a compressive stress on the material with the higher lattice parameter. Thus, if the second portion 1-2 has a higher germanium content than the first portion 1-1, the second portion 1-2 of the semiconductor channel 1 is under compressive stress while the first portion 1-1 of the semiconductor channel 1 is under tensile stress.

FIGS. 7A-7I are plots of the concentration of germanium versus horizontal distance in the channel 1 in a directional parallel to the major surface of the substrate for embodiments of compound heterostructure channels 1. As discussed above, the concentration of germanium may be either constant or graded in a direction perpendicular to the longitudinal direction of the channel 1. That is, the concentration of germanium may be graded in a direction parallel to the major surface 100a of the substrate 100 in a vertical 3D NAND device. In FIGS. 7A-7I, the origin of the plots is adjacent the tunnel dielectric 11 and the distance is measured away from the tunnel dielectric 11. Generally, in the embodiments with at least one graded germanium concentration portion, grading comprises a lower concentration of germanium closer to the tunnel dielectric and a higher concentration of germanium farther from the tunnel dielectric.

FIGS. 7A-7E illustrate embodiments having an abrupt interface 75a. In these embodiments, the concentration of germanium in the first portion 1-1 of the channel 1 and the second portion 1-2 of the channel 1 at the abrupt interface 75a are different. As discussed above, the first portion 1-1 of the semiconductor channel 1 comprises silicon-germanium having a lower concentration of germanium than the second portion 1-2 of the semiconductor channel 1. In FIG. 7A, the germanium concentration in both the first portion 1-1 and the second portion 1-2 of the channel 1 are constant as a function of distance perpendicular to the longitudinal direction of the channel. In an aspect of this embodiment, the first portion 1-1 of the semiconductor channel 1 may comprise substantially germanium free silicon (i.e., substantially no germanium). In FIG. 7B, the concentration of germanium is graded in the first portion 1-1 of the channel 1 while the concentration of germanium in the second portion 1-2 is constant. In FIG. 7C, the concentration of germanium is constant in the first portion 1-1 of the channel 1 while the concentration of germanium in the second portion 1-2 is graded. In FIG. 7D, the concentration of germanium is graded in both the first 1-1 and second 1-2 portions with the same concentration gradient. That is, the change in concentration as a function of distance is the same in both the first 1-1 and second 1-2 portions of the channel 1. In FIG. 7E the concentration of germanium is graded in both the first 1-1 and second 1-2 portions. However, in this embodiment, the concentration gradients in the first 1-1 and second 1-2 portions are different from each other. Preferably, the Ge concentration increases at a higher rate in the second portion 1-2 than in the first portion 1-1 in this embodiment.

FIGS. 7F-7I illustrate embodiments that have a graded (i.e., continuous) interface 75b. That is, the concentration of germanium on both sides of the continuous interface 75b immediately adjacent the continuous interface 75b is the same in both the first 1-1 and second 1-2 portions of the channel 1. In the embodiment illustrated in FIG. 7F, the concentration of germanium is graded in both the first 1-1 and second 1-2 portions of the channel 1 with the same concentration gradient. In FIG. 7G, the concentration of germanium in the first portion 1-1 of the channel is graded while the concentration of germanium in the second portion 1-2 of the channel 1 is constant. In FIG. 7H, the concentration of germanium in the first portion 1-1 of the channel is constant while the concentration of germanium in the second portion 1-2 of the channel 1 is graded. In FIG. 7I, the concentration of germanium is graded in both the first 1-1 and second 1-2 portions of the channel 1. However, in contrast to the embodiment illustrated in FIG. 7F, the concentration gradients in the first 1-1 and second 1-2 portions of the channel 1 are different from each other.

FIGS. 8A-8F are side cross sectional views of illustrating a method of making a channel for a NAND string device according to another embodiment.

Referring to FIG. 8A, a stack 120 of alternating first material layers 3 and second material layers 19 are formed over the major surface 100a of the substrate 100. Layers 3 and 19 may be deposited over the substrate 100 by any suitable deposition method, such as sputtering, CVD, PECVD, MBE, etc. In an embodiment, the first material layers 3 comprise a control gate material, such as doped polysilicon, or a sacrificial material such as silicon nitride. The second material layers 19 comprise an insulating material, such as $SiO_2$.

At least one opening 81 is formed in the stack 120. The at least one opening comprises a memory hole in which the memory film and channel of the NAND strings 180 are formed. The at least one opening 81 may be formed by anisotropic etching, such as by anisotropic reactive ion etching. After forming the at least one opening 81, an optional barrier layer 110 may be formed in the exposed surface of the first material layers 3 in the at least one opening 81. If the first material layers 3 comprises doped polysilicon or silicon nitride, the barrier layer 110 may be formed by oxidizing the exposed surface of the first material layers 3 in the at least one opening 81 by in-situ steam generation (ISSG) or another oxidation method.

After forming the barrier layer 110, a memory film 125 is formed in the at least one opening 81. The memory film 125 may be formed by forming a blocking dielectric 7 over the exposed surfaces of the first 3 and second 19 layers in the at least one opening 81 followed by forming a charge storage layer 9 over the blocking dielectric 7 and a tunnel dielectric 11 over the charge storage layer 9.

Then, as illustrated in FIG. 8B, a sacrificial layer 60 is formed over the tunnel dielectric 11 in at least one opening 81.

The sacrificial layer 60 may be any suitable material, such as a low temperature oxide formed, for example, by the reaction of TEOS with water. A low temperature oxide may be used for the sacrificial layer 60, for example, when the tunnel dielectric 11 comprises silicon oxynirde.

Next, as illustrated in FIG. 8C, an anisotropic etch is performed to remove a portion of the sacrificial layer 60, tunnel dielectric 11, charge storage layer 9 and blocking dielectric 7 from the bottom of the at least one opening 81. In this manner, a portion of the substrate 100 is exposed at the bottom of the at least one opening 81.

Then, as illustrated in FIG. 8D, the remaining sacrificial layer 60 is selectively removed from the at least one opening 81. The sacrificial layer 60 may be selectively removed by anisotropic or isotropic etching. A low temperature oxide has a high etch selectively compared to silicon oxyniride. Therefore, the low temperature oxide may be easily removed without attacking the underlying tunnel dielectric 11 when the tunnel dielectric 11 comprises silicon oxynitride. Alternatively, the tunnel dielectric 11 may comprise $SiO_2$ formed using a TEOS source and the sacrificial layer 60 comprises $SiO_2$ formed using a hexachloro silane (HCD) source which has a different etch rate from the TEOS source based silicon oxided.

Next, as illustrated in FIG. 8E, a compound heterostructure channel 1 is formed in the at least one opening 81. The compound heterostructure channel 1 may be selected from any of the embodiments discussed above. If the respective first and second portions 1-1 and 1-2 of the channel comprise discrete polysilicon and SiGe layers, then these layers may be formed in separate deposition steps. If respective first and second portions 1-1 and 1-2 of the channel comprise SiGe with different Ge concentration, then both portions may be formed during the same deposition step by varying the ratio of the precursors (e.g., decreasing the ratio of silane to germane during CVD) to obtain a Ge concentration difference between SiGe portions 1-1 and 1-2 of the channel. If desired more than two portions of the channel with different Ge concentration may be formed.

Then, as illustrated in FIG. 8F any remaining volume in the at least one opening 81 is filled with an insulating fill material (i.e., the core dielectric) 2. Alternatively, the at least one opening may be completely filled with the compound heterostructure channel 1 in the previous step and the optional insulating fill 2 omitted.

If layers 3 comprise a sacrificial material (e.g., silicon nitride), then layers 3 may be selectively removed from the back side and replaced with metal or metal alloy control gate electrodes, as will be described in more detail with respect to FIGS. 11A-11C.

In another embodiment, the compound heterostructure channel 1 is in-situ doped with carbon during formation. Either the first portion 1-1 of the channel 1, the second portion of the channel 1-2 or both the first 1-1 and second 1-2 portions may be in-situ doped with carbon. In-situ doping with carbon promotes grain growth, thereby reducing the amount of grain boundaries in the channel 1.

In another embodiment, the compound heterostructure channel 1 is in-situ doped with nitrogen during formation, such by using a nitrogen plasma dopant during layer growth. Either the first portion 1-1 of the channel 1, the second portion of the channel 1-2 or both the first 1-1 and second 1-2 portions may be in-situ doped with nitrogen. In-situ doping with nitrogen promotes grain growth, thereby reducing the amount of grain boundaries in the channel 1. Further, in-situ doping with nitrogen passivates grain boundary traps and dangling bonds.

FIGS. 9A-9F are side cross sectional views of illustrating a method of making a channel for a NAND string device according to another embodiment containing an undercut in the memory hole.

In this embodiment, the first steps as illustrated in FIGS. 9A and 9B are the same as those illustrated in FIGS. 8A and 8B and described above, and will not be described again for brevity.

Next, as illustrated in FIG. 9C, an anisotropic etch is performed to remove a portion of the sacrificial layer 60, tunnel dielectric 11, charge storage layer 9 and blocking dielectric 7 from the bottom of the at least one opening 81. In this manner, a portion of the substrate 100 is exposed at the bottom of the at least one opening 81. Then, an isotropic etch is performed to recess a lower portion of the at least one opening 81 by removing a lower portion of the charge storage layer 9, a lower portion of the tunnel dielectric 11 and a lower portion of the sacrificial layer 60 from the sidewall of the bottom portion of the at least one opening 81 to form an undercut 81a below the tunnel dielectric 11 and the charge storage layer 9. In this manner, a larger portion of the substrate 100 is exposed than in the previous embodiment.

Then, as illustrated in FIG. 9D, the sacrificial layer 60 is selectively removed from the at least one opening 81. As in the previous embodiment, the sacrificial layer 60 may be selectively removed by anisotropic or isotropic etching.

Next, as illustrated in FIG. 9E, the channel 1 is formed in the at least one opening 81 and the undercut 81a. In this manner, a semiconductor channel 1 is formed comprising a lower portion 1d located in the undercut having a larger area parallel to the major surface 100a of the substrate 100 than a remaining portion of the semiconductor channel 1. In this embodiment, the semiconductor channel 1 contacts the substrate 100.

Then, as illustrated in FIG. 9F, any remaining volume in the at least one opening 81 may be filled with an optional insulating fill 2. If semiconductor channel 1 does not completely fill the undercut 81a, any remaining volume in the undercut 81a may also be filled to form a lower disc portion 2a of insulating fill 2.

FIGS. 10A-10F are side cross sectional views of illustrating a method of making a channel for a NAND string device according to another embodiment having an epitaxial semiconductor pillar.

In this embodiment, the first steps as illustrated in FIGS. 10A and 10B are the same as those illustrated in FIGS. 8A and 8B (or 9A and 9B) above, and will not be described again for brevity.

Then, as illustrated in FIG. 10C and similar to FIGS. 8C and 9C, an anisotropic etch is performed to remove a portion of the sacrificial layer 60, tunnel dielectric 11, charge storage layer 9 and blocking dielectric 7 from the bottom of the at least one opening 81. In this manner, a portion of the substrate 100 is exposed at the bottom of the at least one opening 81. Then, an optional isotropic etch is performed to recess a lower portion of the at least one opening 81 by removing a lower portion of the charge storage layer 9, a lower portion of the tunnel dielectric 11 and a lower portion of the sacrificial layer 60 from the sidewall of the bottom portion of the at least one opening 81 to form an optional undercut 81a. In this manner, a larger portion of the substrate 100 is exposed than in the previous embodiment.

Then, in contrast to the previous embodiment, an epitaxial (i.e., single crystal semiconductor) pillar 40 is formed on the exposed substrate 100. In an embodiment, the epitaxial pillar completely fills the undercut 81a and a lower portion of the at least one opening 81. In an embodiment, the substrate comprises silicon and the epitaxial pillar comprises epitaxial silicon.

Next, as illustrated in FIG. 10D, the sacrificial layer 60 is removed from the at least one opening 81, such as by wet etching. An optional dry cleaning process may also be performed.

Then, as illustrated in FIG. 10E, the semiconductor channel 1 is formed in the at least one opening 81. As in the previous embodiments, the semiconductor channel 1 comprises a heterostructure channel with a first portion 1-1 adjacent the tunnel dielectric 11 having a lower (or substantially free) germanium concentration and a second portion 1-2 located away from the tunnel dielectric 11 having a higher Ge concentration. The bottom part of the heterostructure channel 1 contacts the top of the pillar 40.

Next, as illustrated in FIG. 10F, an insulating fill material 2 is formed to fill any volume remaining in the at least one opening 81 after forming the semiconductor channel 1.

FIGS. 11A-11C are side cross sectional view illustrating a method of making a NAND string according to another embodiment in which control gates are formed by a replacement process. In this embodiment, as illustrated in FIG. 11A, a stack 120 of alternating first insulating material layers 121 and second sacrificial material layers 122 are formed over the major surface 100*a* of the substrate 100. In this embodiment, the materials for the first insulating material layers 121 and second sacrificial material layers 122 are chosen so that the second sacrificial material layers 122 may be selectively etched relative to the first insulating material layers 121. In this manner, the second sacrificial material layers 122 may be removed while leaving the first insulating material layers 121. In an embodiment, the first insulating material comprises an oxide, such as silicon oxide, and the second sacrificial material comprises a nitride, such as silicon nitride.

As in the previous embodiments, at least one opening 81 (e.g., memory hole) is formed in the stack. A memory film 125 is formed in the at least one opening. In this embodiment, forming the memory film 125 includes forming charge storage material 9 over a sidewall of the at least one opening 81, forming a tunnel dielectric 11 over the charge storage material 9 and forming a semiconductor channel 1 over the tunnel dielectric 11. A portion of the blocking dielectric may also be formed in the opening 81 or the blocking dielectric may be omitted from the opening 81

Next, as illustrated in FIG. 11B, at least one back side opening 84 (e.g., back side trench) is formed in the stack 120. After forming the at least one back side opening 84, at least portions of the second material layers 122 are selectively removed through the at least one back side opening 84 to form back side recesses 64 between adjacent first material layers 121.

The blocking dielectric 7 may then be deposited in the at least one back side opening 84 and in the back side recesses 64. In an embodiment, the blocking dielectric 7 comprises a plurality of metal oxide clam shaped regions in the back side recesses 64. Then, control gate electrodes 3 may be formed in the clam shaped regions of the blocking dielectric 7 in the back side recesses 64, followed by removing the blocking dielectric and the control gate material from the back side opening 84.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A monolithic three dimensional NAND string, comprising:
   a semiconductor channel, at least one end part of the semiconductor channel extending substantially perpendicular to a major surface of a substrate;
   a plurality of control gate electrodes extending substantially parallel to the major surface of the substrate, wherein the plurality of control gate electrodes comprise at least a first control gate electrode located in a first device level and a second control gate electrode located in a second device level located over the major surface of the substrate and below the first device level, wherein the first control gate electrode is separated from the second control gate electrode by an insulating layer located between the first and second control gates;
   a blocking dielectric located adjacent the plurality of control gate electrodes;
   at least one charge storage region located adjacent the blocking dielectric; and
   a tunnel dielectric located between the at least one charge storage region and the semiconductor channel,
   wherein a second portion of the semiconductor channel comprises silicon and germanium and contains more germanium than a first portion of the semiconductor channel which is located closer to the tunnel dielectric than the second portion.

2. The monolithic three dimensional NAND string of claim 1, wherein the second portion of the semiconductor channel comprises silicon-germanium having a constant germanium concentration throughout the second portion of the channel.

3. The monolithic three dimensional NAND string of claim 1, wherein the second portion of the channel comprises silicon-germanium having a graded germanium concentration in the second portion of the channel.

4. The monolithic three dimensional NAND string of claim 3, wherein the graded germanium concentration comprises a lower concentration of germanium closer to the tunnel dielectric and a higher concentration of germanium farther from the tunnel dielectric.

5. The monolithic three dimensional NAND string of claim 1, wherein the first portion of the semiconductor channel comprises substantially germanium free silicon or silicon-germanium having a lower concentration of germanium than the second portion.

6. The monolithic three dimensional NAND string of claim 5, wherein the first portion of the semiconductor channel comprises the substantially germanium free silicon.

7. The monolithic three dimensional NAND string of claim 5, wherein the first portion of the semiconductor channel comprises the silicon-germanium having a lower concentration of germanium than the second portion.

8. The monolithic three dimensional NAND string of claim 7, wherein:
   the second portion of the semiconductor channel comprises a constant germanium concentration throughout the second portion of the semiconductor channel;
   the first portion of the semiconductor channel comprises a constant germanium concentration throughout the first portion of the semiconductor channel;
   the concentration of germanium in the first portion is lower than the concentration in the second portion; and a change in germanium concentration at an interface between the second portion and the first portion is abrupt.

9. The monolithic three dimensional NAND string of claim 7, wherein the first portion of the channel comprises a graded concentration having a first germanium concentration gradient in a direction parallel to the major surface of the substrate and the second portion of the channel comprises a graded concentration having a second germanium concentration gradient in the direction parallel to the major surface of the substrate.

10. The monolithic three dimensional NAND string of claim 9, wherein the first germanium concentration gradient the same as the second germanium concentration gradient and the channel comprises an abrupt interface between the first and the second portions of the channel.

11. The monolithic three dimensional NAND string of claim 9, wherein the first germanium concentration gradient is the same as the second germanium concentration gradient and the channel lacks an abrupt interface between the first and the second portions of the channel.

12. The monolithic three dimensional NAND string of claim 9, wherein the first germanium concentration gradient is different from the second germanium concentration gradient and the channel comprises an abrupt interface between the first and the second portions of the channel.

13. The monolithic three dimensional NAND string of claim 9, wherein the first germanium concentration gradient is different from the second germanium concentration gradient and the channel lacks an abrupt interface between the first and the second portions of the channel.

14. The monolithic three dimensional NAND string of claim 7, wherein one of the first or the second portions of the semiconductor channel has a graded germanium concentration and the other one of the first or the second portions of the semiconductor channel has a constant germanium concentration.

15. The monolithic three dimensional NAND string of claim 1, wherein the second portion of the semiconductor channel is under compressive stress and the first portion of the semiconductor channel is under tensile stress.

16. The monolithic three dimensional NAND string of claim 1, wherein the semiconductor channel comprises a hollow cylinder and wherein the NAND string further comprises an insulating core fill in the hollow cylinder.

17. The monolithic three dimensional NAND string of claim 1, wherein a bottom portion of the semiconductor channel is located in an undercut below the tunnel dielectric and the at least one charge storage region.

18. The monolithic three dimensional NAND string of claim 1, wherein the semiconductor channel is polycrystalline and doped with carbon or nitrogen.

19. The monolithic three dimensional NAND string of claim 1, wherein the substrate is silicon and the NAND string further comprises an epitaxial silicon pillar located between the substrate and the semiconductor channel.

20. The monolithic three dimensional NAND string of claim 1, wherein:
 the substrate comprises a silicon substrate;
 the monolithic three dimensional NAND string is located in an array of monolithic three dimensional NAND strings over the silicon substrate;
 at least one memory cell in the first device level of the three dimensional array of NAND strings is located over another memory cell in the second device level of the three dimensional array of NAND strings; and
 the silicon substrate contains an integrated circuit comprising a driver circuit for the memory device located thereon.

\* \* \* \* \*